United States Patent
Liu et al.

(10) Patent No.: US 7,345,848 B2
(45) Date of Patent: Mar. 18, 2008

(54) PACKAGING STRUCTURE OF MINI SD MEMORY CARD

(75) Inventors: Chin-Chun Liu, Pingjhen (TW); Shih-Tung Liu, Fuji Village (TW)

(73) Assignee: Sun-Light Electronic Technologies Inc., Fuji Village, Gongguan Township, Miaoli County (TW)

( * ) Notice: Subject to any disclaimer, the term of this patent is extended or adjusted under 35 U.S.C. 154(b) by 351 days.

(21) Appl. No.: 11/272,060

(22) Filed: Nov. 14, 2005

(65) Prior Publication Data

US 2007/0108295 A1 May 17, 2007

(51) Int. Cl.
*G11B 23/03* (2006.01)
*G06K 19/06* (2006.01)
(52) U.S. Cl. ........................ 360/133; 235/492
(58) Field of Classification Search ............... None
See application file for complete search history.

(56) References Cited

U.S. PATENT DOCUMENTS

| | | | |
|---|---|---|---|
| 6,655,973 B2 * | 12/2003 | Ji et al. ................. | 439/159 |
| 6,903,935 B1 * | 6/2005 | Chen .................... | 361/737 |
| 7,271,475 B2 * | 9/2007 | Wada et al. ............ | 257/679 |
| 2005/0279838 A1 * | 12/2005 | Wang et al. ............ | 235/492 |
| 2006/0220201 A1 * | 10/2006 | Liu et al. ............... | 257/679 |
| 2007/0034699 A1 * | 2/2007 | Lin ....................... | 235/486 |
| 2007/0063329 A1 * | 3/2007 | Liu et al. ............... | 257/679 |
| 2007/0278301 A1 * | 12/2007 | Yu et al. ................ | 235/441 |

* cited by examiner

*Primary Examiner*—Allen Cao
(74) *Attorney, Agent, or Firm*—Dykema Gossett PLLC

(57) ABSTRACT

The present invention provides an improved packaging structure of a memory card, such as mini SD memory card. The packaging structure comprises a substrate having a plurality of integrated circuit devices and passive devices located therein, and a metal cover having an insulating layer formed on a top portion of the metal cover. A plurality of protruding plates bending downward are formed around a circumferential area of the metal cover, and a roll-shaped fixing part is formed at a bottom portion of a particular protruding plate. The roll-shaped fixing part and the protruding plates are utilized to engage the frame with the metal cover to form a sealed structure so that the frame covers all the protruding plates and the roller-shaped fixing part of the metal cover. The integrated circuit devices and the passive devices are located within the space of the frame to form a mini SD memory card package.

4 Claims, 5 Drawing Sheets

PACKAGING STRUCTURE OF MINI SD MEMORY CARD

BACKGROUND OF THE INVENTION

1. Field of Invention

The present invention relates generally to an improved structure of memory card package. More particularly, the present invention relates to an improved design of a package structure of mini SD memory card.

2. Description of the Related Art

The conventional package structure of mini SD memory card is showed in FIG. 1 and FIG. 2. The package structure comprises a plastic cover 10 covered a memory substrate 20. The plastic cover 10 comprises a L-shaped upper cover 101 and a bottom cover 102. When the upper cover 101 and the bottom cover 102 are integrated together, a space 103 is form in between. Variety of integrated circuit (IC) devices and passive devices are formed on a top surface of a circuit of the memory substrate 20 (including flash IC). A plurality of golden fingers are formed on a back surface of the circuit and electrically connected to other electrical products. The memory substrate 20 is then placed inside the space 103 and a welding method is utilized to integrate the upper cover 101 and the bottom cover 102. Therefore, package of mini SD memory card is formed.

The conventional packaging structure of mini SD memory card must utilize the plastic cover 10 to seal the whole packaging structure. The fabrication of the top cover 101 and the bottom cover 102 must be formed into a projecting shapes that a space 103 can be formed in between as shown in FIGS. 1 & 2. As result the thickness of the top cover 101 and the bottom cover 102 must be maintained to a required thickness so that the structure is strong enough to subject any pressure. However, when the thickness of the covers 101 and 102 are increased, the space 103 between the covers is thus reduced. As a result, less IC devices can be located inside the substrate. As a matter fact, most fabricators utilized those expansive, very thin and small in size of IC devices in order to accommodate the limited space 103. Thus, the manufacturing cost of the package of the memory card is increased. Furthermore, those expansive IC devices are not reliable, and the cost of the package structure of the mini SD memory card is thus increased, its competitiveness in the market is therefore reduced.

SUMMARY OF INVENTION

It is an object of the present invention to provide an improved packaging structure of a type of memory card. More particularly, the present invention relates to an improved packaging structure of mini SD memory card. The present invent provide an improved design that has enough space within the mini SD memory card package so that different types of IC devices and passive devices can be installed therein. It is another object of the present invention to provide an improved design of the packaging structure of the mini SD memory card that comprises reliable IC devices and can be fabricated with low cost in order to increase its competition in the market.

The packaging structure of the present invention comprises a substrate having a plurality of integrated circuit devices and passive devices located therein, and a metal cover having an insulating layer formed on a top portion of the metal cover. A plurality of protruding plates bending downward are formed around a circumferential area of the metal cover, and a roll-shaped fixing part is formed at a bottom portion of a particular protruding plate. The roll-shaped fixing part and the protruding plates are utilized to engage the frame with the metal cover to form a sealed structure so that the frame covers all the protruding plates and the roller-shaped fixing part of the metal cover. The integrated circuit devices and the passive devices are located within the space of the frame to form a mini SD memory card package.

Both the foregoing general description and the following detailed description are exemplary and explanatory only and are restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
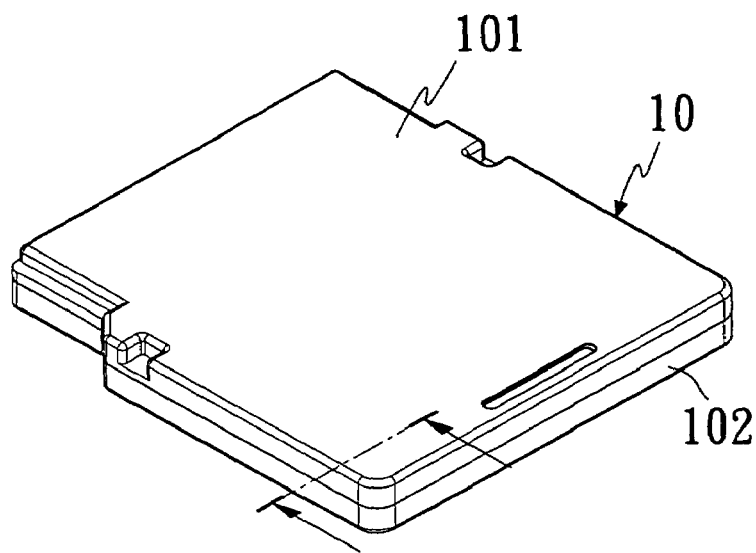
FIG. 1 illustrates a 3-D view of a conventional packaging structure of mini SD memory card.
Figure 2:
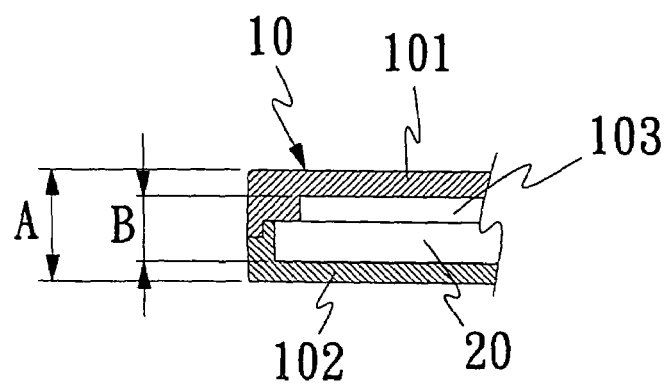
FIG. 2 shows a partial cross-sectional view of the conventional packaging structure of mini SD memory card.
Figure 3:
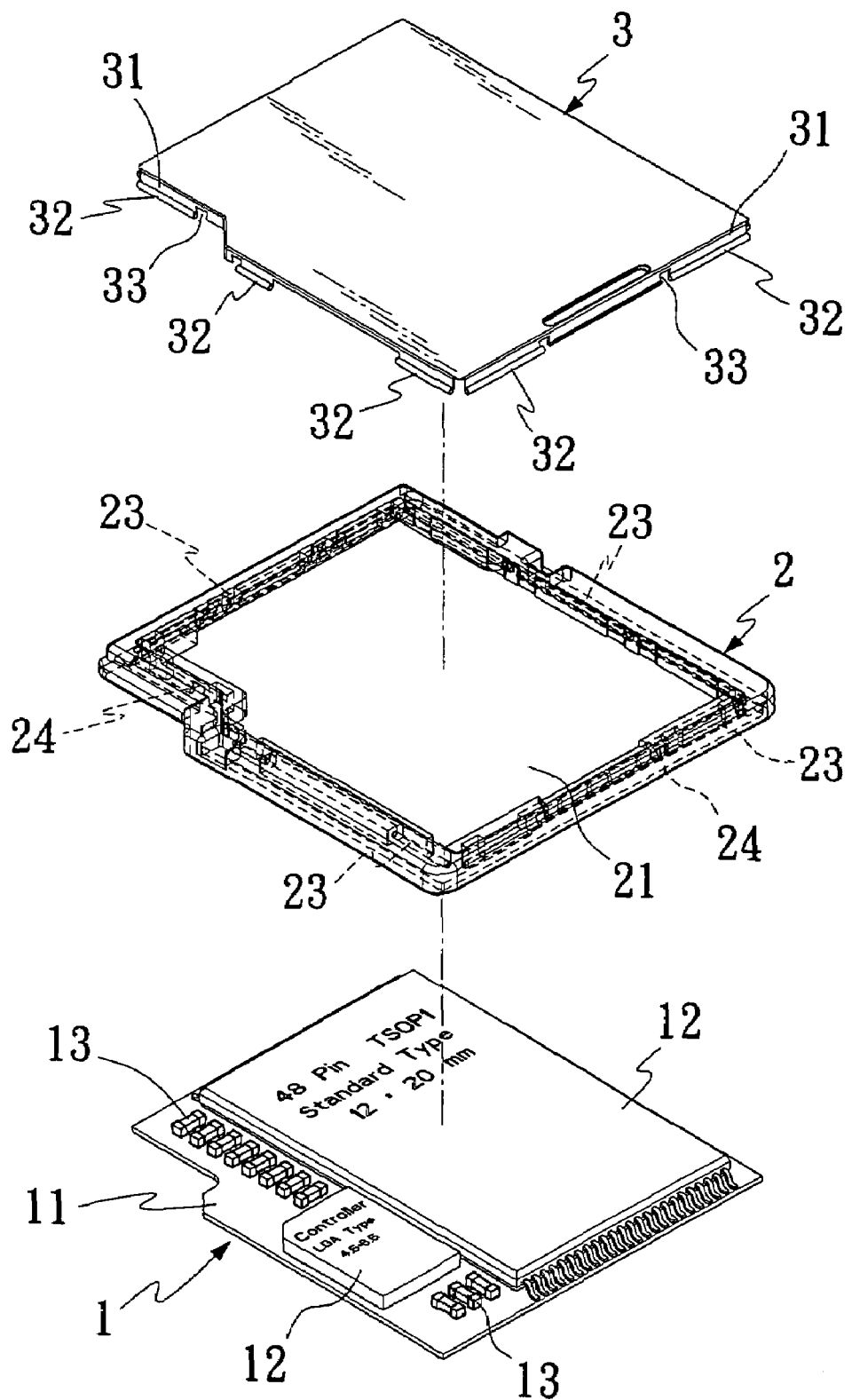
FIG. 3 is a 3-D assembled view of an improved packaging structure of mini SD memory card in accordance with a preferred example of the present invention.
Figure 4:
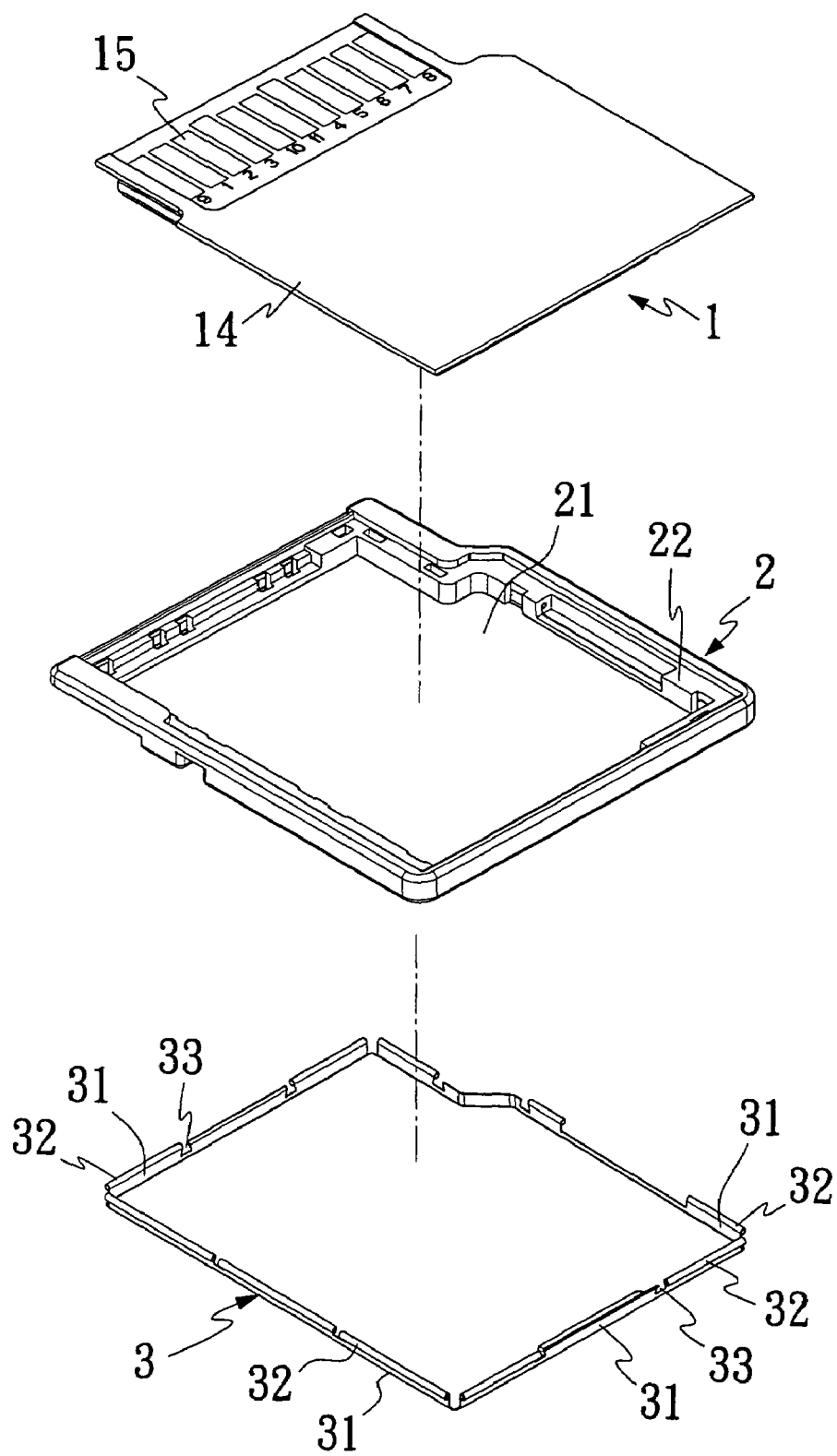
FIG. 4 is another 3-D assembled view of an improved packaging structure of mini SD memory card in accordance with the preferred example of the present invention.

Refer to FIG. 3 and FIG. 4, the present invention provides an improved packaging structure of mini SD memory card, the improved structure comprises a substrate 1, a frame 2 and a metal cover 3. Wherein the substrate 1, as shown in FIG. 3 and FIG. 4, is a circuit board consisting required circuits formed on its platform. An inner platform 11 comprising various type of integrated circuit (IC) devices 12 that are required by a memory card, such as the control chip device and flash IC chip, as well as other passive devices 13. A plurality of pins 15 qualified for utilizing in the mini SD memory card are formed in an outer platform 14. The pins 15 can electrical connected to other electrical products rapidly, such as a carryable memory device, cell phone digital camera and reading memory device.

The frame 2, as shown in FIG. 3 and FIG. 4, is a square plastic frame for locating the substrate 1 and is utilized to protect the IC devices 12 and the passive devices 13. The metal cover 3 is utilized to seal the frame 2 off. A space 21 is formed in a middle portion of the frame 2, wherein a big size of gap 22 is formed around and below a circumferential area of the space 21. As a result, the gap 22 and the space 21 are designed in such to form a step-shaped structure so that the space is big enough to locate the substrate 1. Strip-shaped of slots 23 are formed around the circumferential area of the space 21 of the frame 2 so that they can engaged directly with the metal cover 3. A plurality of protruding blocks 24 are formed at one side of the strip-shaped of slots 23 in order to engage with the metal cover 3.

The metal cover 3, as shown in FIG. 3 and FIG. 4, is utilized to cover the variety of IC devices 12 and the passive device 13 formed on top surface of the frame 2 so that a sealed thin layer of metal device is formed. This thin layer of metal device is approximately 0.05 mm thick and an insulating layer is formed onto its surface. A plurality of protruding plates 31 are formed around a circumferential area of a bottom portion of the metal cover 3, wherein the protruding plates 31 are bended into L-shaped along the edges of the metal cover 3. A plurality of fixing parts 32 are formed and bended into roll-shaped portions at one end of every protruding plate 31, the roll-shaped fixing parts 32 are either bended towards an inner or an outer part of the protruding plates 31. Fixing slots 33 are formed correspondingly to the position of the protruding blocks 24 along the protruding plates 31, wherein the fixing slots 33 can be formed into a V-shaped structure.

Figure 5:
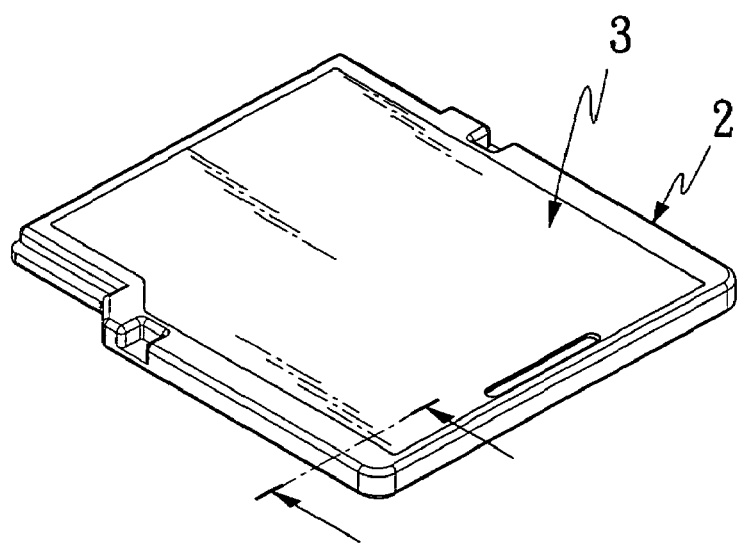
FIG. 5 is a 3-D view of a completely assembled structure of the mini SD memory card in accordance with the preferred example of the present invention.
Figure 6:
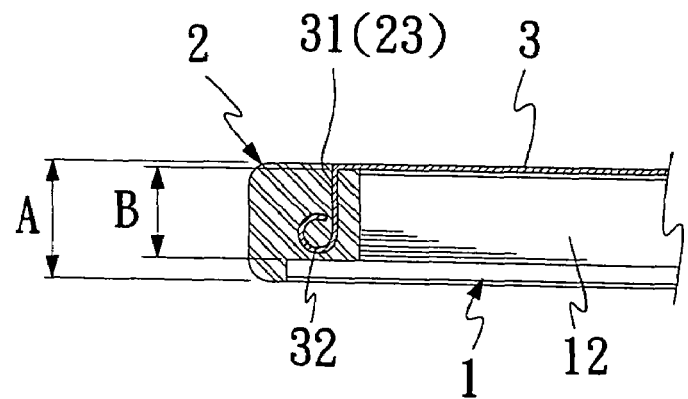
FIG. 6 is a partial cross-sectional view of the assembled structure of the mini SD memory card in FIG. 5
Figure 7:
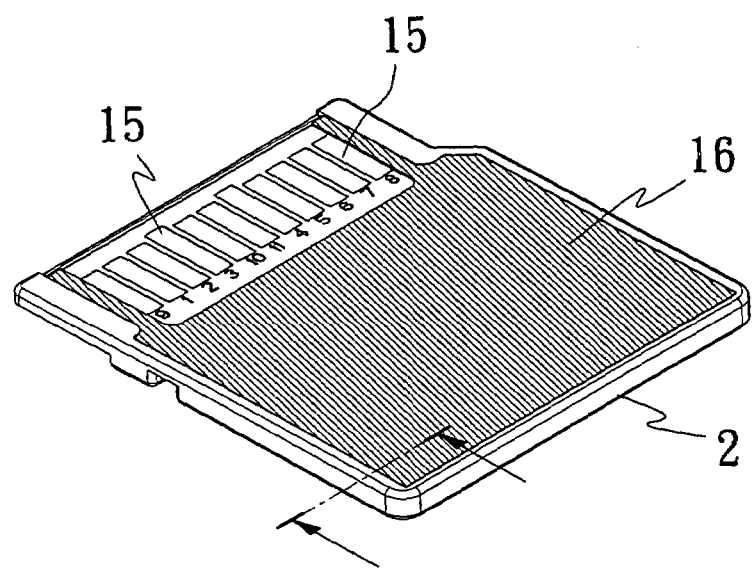
FIG. 7 is a 3-D view of a coating layer onto a substrate of a preferred example of the present invention.
Figure 8:
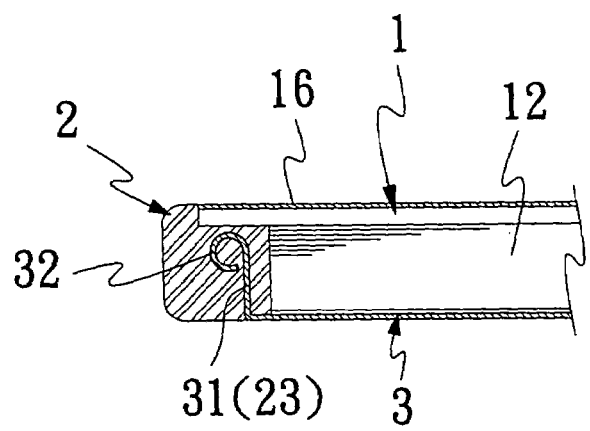
FIG. 8 is a partial cross-sectional view of the coating layer of the substrate in FIG. 7.

The frame 2 is directly engaged with the metal cover 3 to form a projecting shape structure as shown on FIGS. 5 and 6. The protruding plates 31 forming around the circumferential area, the roll-shaped fixing parts 32 and the fixing slots 33 of the metal cover 3 are covered by the adhesive material of the frame 2 to form a fixed structure. The strip-shaped of slots 23 formed around the circumferential area of the frame 2 and the protruding blocks 24 are engaged directly with the protruding plates 31 to form the fixed structure. The substrate is integrated with the gap 22 of the frame 2 so that the IC devices 12 and the passive devices 13 located inside the substrate is sealed by the metal cover 3. A coating layer 16 is form on an outer surface 14 of the substrate 1 is filled up the space as shown in FIG. 7 and FIG. 8. Therefore, a completed improved packaging structure of mini SD memory card is formed The present invention provides an improved design of packaging structure that contained more adhesive materials than the conventional design, thus, the hardness and the strength of the metal cover 3 is much better than the prior art. As a result, the metal cover 3 can be fabricated into a very thin layer, approximately 0.05 mm. The present invention particularly improves the integrated structure between the metal cover 3 and the frame 2 so that the size of the space 21 inside the frame 2 can be increased as well as the standard requirements of the thickness of the mini SD memory card can be achieved.

Refer to FIG. 5, the space 21 of the frame can locate passive devices 13 and various IC devices 12 of the substrate, such as the control chip device and flash IC chip. The present invention provides an improved packaging structure that provides a spacious space inside the frame to locate different types of devices. The fabricators can then deiced and choose various types of IC devices that are more reliable and low cost in packaging, more particularly the flash IC chips. The improved packaging structure of the present invention provides enough space inside the structure to locate those required devices so that the fabricators do not have to choose those expansive and very thin structures of chips due to lack of space in the packaging structure. The cost of the fabricating the mini SD memory card can be reduced. The present invention provides an improved design of the packaging structure that can be utilized in different kinds of IC devices, so that various of packaging structures of IC devices can be achieved. The competitiveness of the mini SD memory packages in the market is thus increased.

The forgoing is considered illustrative of the principles of the invention. As variations and related embodiments may occur to those skilled in the art, it is to be appreciated the invention, and all suitable modifications and equivalents, are only to be limited by the scope of the claims following hereinafter.

What is claimed is:

1. An improved packaging structure of a memory card, such as mini SD memory card, comprising:
   a substrate having a plurality of integrated circuit devices and passive devices located inside the substrate;
   a frame having a space formed in a middle part of the frame; and
   a metal cover having an insulating layer formed on a top portion of the metal cover, wherein a plurality of protruding plates bending downward are formed around a circumferential area of the metal cover, a roll-shaped fixing part is formed at a bottom portion of a particular protruding plate, wherein the roll-shaped fixing part and the protruding plates are utilized to engage the frame with the metal cover to form a sealed structure so that the frame covers all the protruding plates and the roller-shaped fixing part of the metal cover, the integrated circuit devices and the passive devices are located within the space of the frame, and are sealed by the metal cover to form a mini SD memory card package.

2. The improved packaging structure of claim 1, wherein a plurality of fixing slots are formed around protruding plates of the metal cover, strip-shaped of slots are formed around a circumferential area of the space of the frame and those strip-shaped of slots engaged directly with the protruding plates and the roll-shaped fixing part of the metal cover, a protruding block is formed inside the strip-shaped of slots and is integrated with a corresponding fixing slot.

3. The improved packaging structure of claim 1, wherein the roll-shaped fixing part is formed into a circular shape.

4. The improved packaging structure of the claim 1, wherein a coating layer formed on an outer surface of the substrate is utilized to fill up the space of the frame.

* * * * *